(12) United States Patent
Paisley et al.

(10) Patent No.: US 6,797,069 B2
(45) Date of Patent: Sep. 28, 2004

(54) GAS DRIVEN PLANETARY ROTATION APPARATUS AND METHODS FOR FORMING SILICON CARBIDE LAYERS

(75) Inventors: Michael James Paisley, Garner, NC (US); Joseph John Sumakeris, Apex, NC (US)

(73) Assignee: Cree, Inc., Durham, NC (US)

( * ) Notice: Subject to any disclaimer, the term of this patent is extended or adjusted under 35 U.S.C. 154(b) by 257 days.

(21) Appl. No.: 10/117,858

(22) Filed: Apr. 8, 2002

(65) Prior Publication Data

US 2003/0188687 A1 Oct. 9, 2003

(51) Int. Cl.[7] .................. H01L 21/306; C23C 16/00
(52) U.S. Cl. ............. 118/730; 118/500; 156/345.55; 156/345.51; 204/298.27
(58) Field of Search .................. 118/730, 725, 118/500; 156/345.55, 345.51; 204/298.7

(56) References Cited

U.S. PATENT DOCUMENTS

| | | | |
|---|---|---|---|
| 3,424,628 A | 1/1969 | Winings | 148/175 |
| 4,722,911 A | 2/1988 | Frijlink | 437/110 |
| 4,748,135 A | 5/1988 | Frijlink | 437/102 |
| 4,860,687 A | 8/1989 | Frijlink | 118/500 |
| 4,961,399 A | 10/1990 | Frijlink | 118/730 |
| 4,976,217 A | 12/1990 | Frijlink | 118/733 |
| 5,027,746 A | 7/1991 | Frijlink | 118/724 |
| 5,056,555 A | 10/1991 | Frijlink | 137/522 |
| 5,108,540 A | 4/1992 | Frijlink | 156/612 |
| 5,226,383 A | 7/1993 | Bhat | 118/730 |
| 5,468,299 A | 11/1995 | Tsai | 118/730 |
| 5,558,721 A | 9/1996 | Kohmura et al. | 118/730 |
| 5,674,320 A | 10/1997 | Kordina et al. | 118/500 |
| 5,695,567 A | 12/1997 | Kordina et al. | 118/725 |
| 5,704,985 A | 1/1998 | Kordina et al. | 118/725 |
| 5,759,263 A | 6/1998 | Nordell et al. | 117/98 |
| 5,788,777 A | 8/1998 | Burk, Jr. | 118/730 |
| 5,792,257 A | 8/1998 | Kordina et al. | 117/90 |
| 5,858,102 A | 1/1999 | Tsai | 118/719 |
| 5,879,462 A | 3/1999 | Kordina et al. | 118/725 |
| 6,005,226 A | 12/1999 | Aschner et al. | 219/390 |
| 6,030,661 A | 2/2000 | Kordina et al. | 427/248.1 |
| 6,039,812 A | 3/2000 | Ellison et al. | 118/725 |
| 6,048,398 A | 4/2000 | Vehanen et al. | 117/200 |
| 6,093,253 A | 7/2000 | Löfgren et al. | 118/725 |
| 2001/0002948 A1 | 6/2001 | Aschner et al. | 392/418 |
| 2002/0090454 A1 | 7/2002 | Paisley et al. | 427/248.1 |

OTHER PUBLICATIONS

U.S. patent application Ser. No. 10/017,492, filed Oct. 30, 2001.

Press Release, *Sterling Semiconductor Placed Order for Second EPIGRESS SIC CVD System*, Oct. 24, 2001, at http://www.compoundsemiconductor.net/PressReleases/2001/PR 10240102.htm.

International Search Report for PCT/US03/03196, dated May 13, 2003.

*Primary Examiner*—Gregory Mills
*Assistant Examiner*—Ram N Kackar
(74) *Attorney, Agent, or Firm*—Myers Bigel Sibley & Sajovec

(57) ABSTRACT

A gas driven rotation apparatus for use with a flow of drive gas includes a base member having an upper surface, a main platter overlying the upper surface of the base member, and a satellite platter overlying the main platter. The apparatus is adapted to direct the flow of drive gas between the upper surface of the base member and the main platter such that the main platter is rotated relative to the base member by the flow of drive gas. At least a portion of the flow of drive gas is directed from between the upper surface of the base member and the main platter to between the main platter and the satellite platter such that the satellite platter is rotated relative to the main platter by the at least a portion of the flow of drive gas.

27 Claims, 9 Drawing Sheets

US 6,797,069 B2

GAS DRIVEN PLANETARY ROTATION APPARATUS AND METHODS FOR FORMING SILICON CARBIDE LAYERS

STATEMENT OF GOVERNMENT

The present invention was made with Government support under Air Force Research Laboratory Contact No.F33615-00-C-5403 awarded by The United States Air Force. The Government has certain rights in this invention.

FIELD OF THE INVENTION

The present invention relates to methods and apparatus for rotating a substrate and, more particularly, to such methods and apparatus providing gas driven rotation to the substrate.

BACKGROUND OF THE INVENTION

Silicon carbide (SiC) is increasingly recognized as an effective semiconductor material for electronic devices. SiC possesses a number of properties that make it particularly attractive for applications requiring devices to operate at high temperature, power and/or frequency. SiC exhibits highly efficient heat transfer and is capable of withstanding high electric fields.

It has been demonstrated that hot-wall chemical vapor deposition (CVD) reactors can provide epitaxial layers of SiC with morphology and doping superior to cold-wall systems. See, for example, U.S. Pat. No. 5,695,567 to Kordina et al., the disclosure of which is hereby incorporated herein by reference. It has further been demonstrated that the addition of substrate rotation to a hot-wall CVD system may improve both the per cycle capacity of the system and the uniformity of the epitaxial layers obtained. U.S. Pat. No. 4,860,687 to Frijlink discloses a device comprising a flat susceptor rotating parallel to a reference surface. The device disclosed therein may be used in a vapor phase epitaxy system.

SUMMARY OF THE INVENTION

According to embodiments of the present invention, a gas driven rotation apparatus for use with a flow of drive gas includes a base member having an upper surface, a main platter overlying the upper surface of the base member, and a satellite platter overlying the main platter. The apparatus is adapted to direct the flow of drive gas between the upper surface of the base member and the main platter such that the main platter is rotated relative to the base member by the flow of drive gas. At least a portion of the flow of drive gas is directed from between the upper surface of the base member and the main platter to between the main platter and the satellite platter such that the satellite platter is rotated relative to the main platter by the at least a portion of the flow of drive gas.

According to further embodiments of the present invention, a gas driven rotation apparatus for use with a flow of drive gas includes a base member having an upper surface and a main platter having an upper surface and overlying the upper surface of the base member. At least one generally radially extending, substantially straight satellite drive channel is formed in the upper surface of the main platter. A satellite platter overlies the main platter and the at least one satellite drive channel. The apparatus is adapted to direct at least a portion of the flow of drive gas through the satellite drive channel to rotate the satellite platter relative to the main platter about an axis of rotation.

According to further embodiments of the present invention, a gas driven rotation apparatus for use with a flow of drive gas includes a base member having an upper surface, a main platter overlying the upper surface of the base member, and a satellite platter overlying the main platter. The apparatus is adapted to rotate the main platter relative to the base member in a first direction. The satellite platter is rotated relative to the main platter in a second direction opposite the first direction. At least one of the rotation of the main platter and the rotation of the satellite platter is driven by the flow of drive gas.

According to method embodiments of the present invention, a method for rotating an article includes providing a gas driven rotation apparatus including a base member having an upper surface, a main platter overlying the upper surface of the base member, and a satellite platter overlying the main platter. The article is placed on the satellite platter. A substrate is placed on the satellite platter. A flow of drive gas is directed between the upper surface of the base member and the main platter such that the main platter is rotated relative to the base member by the flow of drive gas. At least a portion of the flow of drive gas is directed from between the upper surface of the base member and the main platter to between the main platter and the satellite platter such that the satellite platter is rotated relative to the main platter by the at least a portion of the flow of drive gas According to further method embodiments of the present invention, a method for rotating an article includes providing a gas driven rotation apparatus including a base member having an upper surface, a main platter overlying the upper surface of the base member, and a satellite platter overlying the main platter. The article is placed on the satellite platter. The main platter is rotated relative to the base member in a first direction. The satellite platter is rotated relative to the main platter in a second direction opposite the first direction. At least one of the rotation of the main platter and the rotation of the satellite platter is driven by a flow of drive gas.

Objects of the present invention will be appreciated by those of ordinary skill in the art from a reading of the Figures and the detailed description of the preferred embodiments which follow, such description being merely illustrative of the present invention.

BRIEF DESCRIPTION OF THE DRAWINGS

The accompanying drawings, which are incorporated in and constitute a part of the specification, illustrate embodiments of the invention and, together with the description, serve to explain principles of the invention.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein;

rather, these embodiments are provided so that this disclosure will be thorough and complete, and will fully convey the scope of the invention to those skilled in the art. Like numbers refer to like elements throughout.

Figure 1:
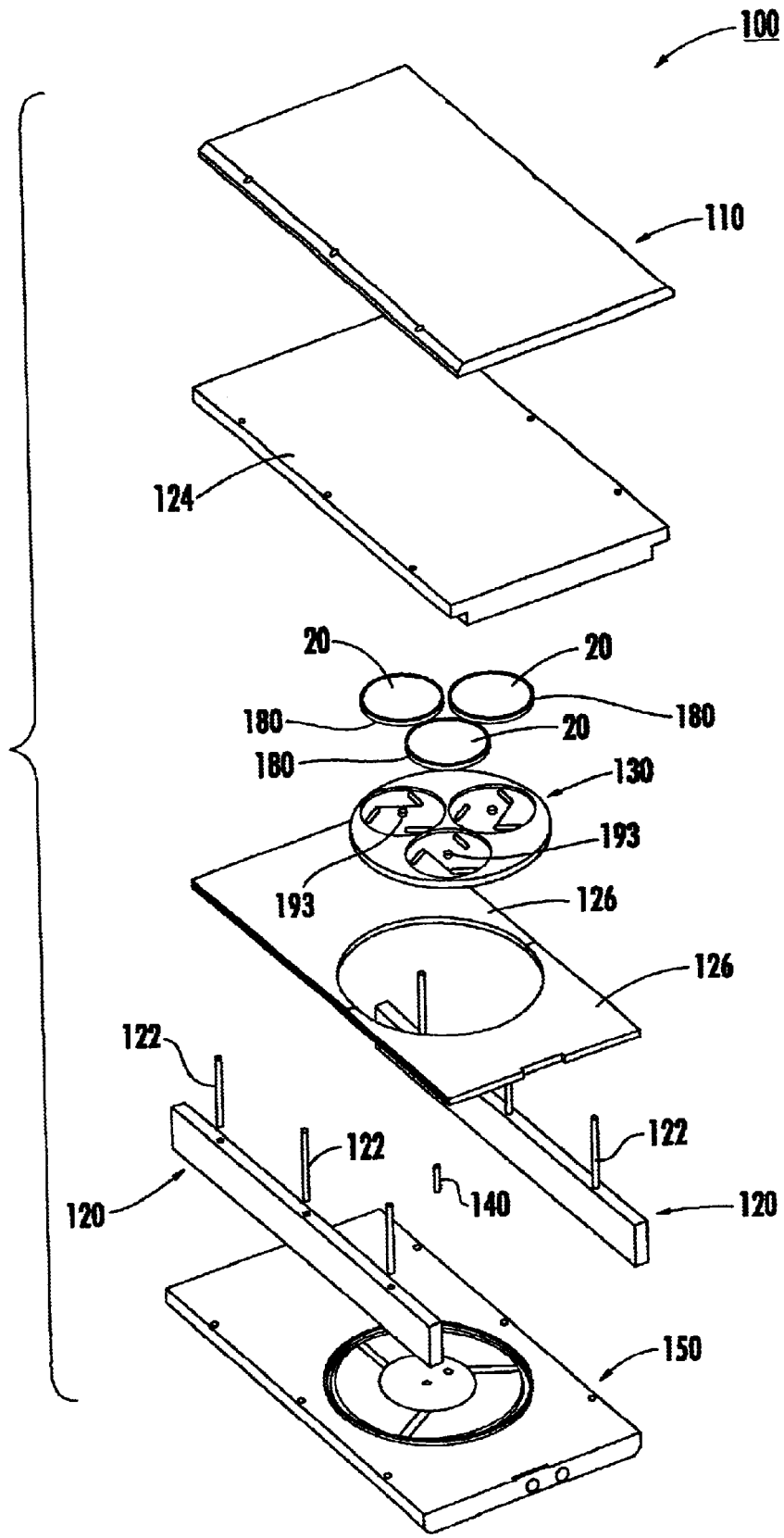
FIG. 1 is an exploded, perspective view of a susceptor assembly according to embodiments of the present invention.
Figure 2:
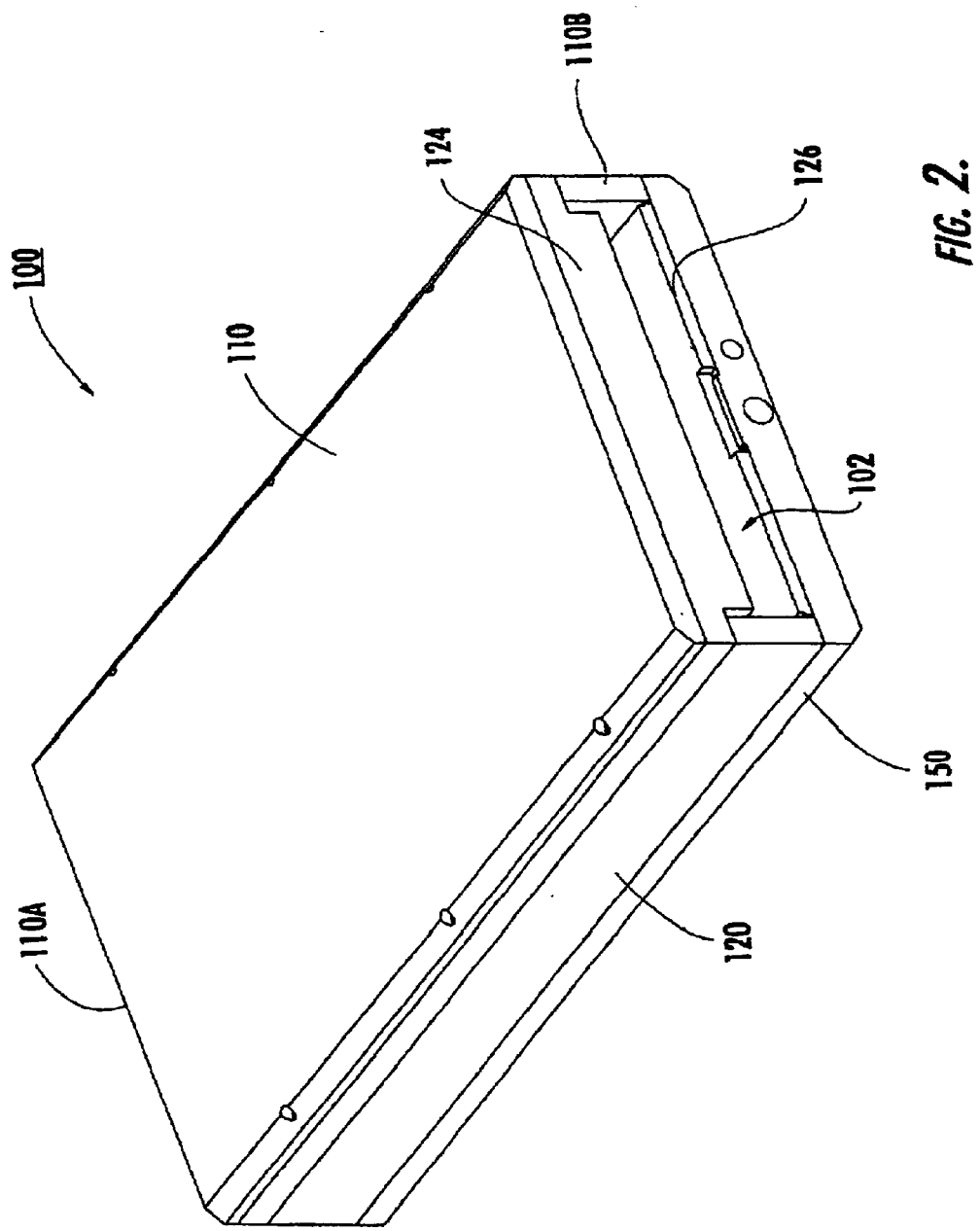
FIG. 2 is a perspective view of the susceptor assembly of FIG. 1.
Figure 3:
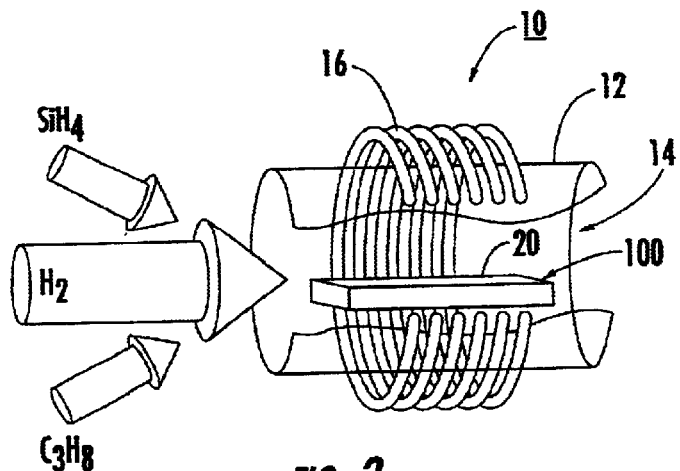
FIG. 3 is a schematic view of a hot-wall CVD system according to embodiments of the present invention incorporating the susceptor assembly of FIG. 1.

With reference to FIGS. 1 and 2, a susceptor assembly 100 according to embodiments of the present invention is shown therein. The susceptor assembly 100 may be used in a hot-wall CVD system 10 as shown in FIG. 3, wherein the susceptor 100 is schematically illustrated. With the exception of the susceptor assembly 100, the hot-wall CVD system may be of conventional construction and use. The system 10 includes a quartz tube 12 defining a through passage 14. The tube 12 is surrounded by an RF coil 16. The assembly 100 is disposed in the tube 12. Precursor gases such as silane ($SiH_4$) and propane ($C_3H_8$) are introduced with and transported by a carrier of purified hydrogen gas ($H_2$) into and through the tube 12. The RF coil 16 inductively heats the susceptor assembly 100 to provide a hot zone where the SiC deposition reactions take place. More particularly, a layer of SiC is grown on the exposed surfaces of the target wafers 20 (schematically illustrated in FIG. 3). Modifications to the system 10 and the method of using the same will be understood by those of ordinary skill in the art upon reading the description herein. It will be appreciated that the present invention may be used in other types of reactors and with other types of heating devices and techniques.

Figure 12:
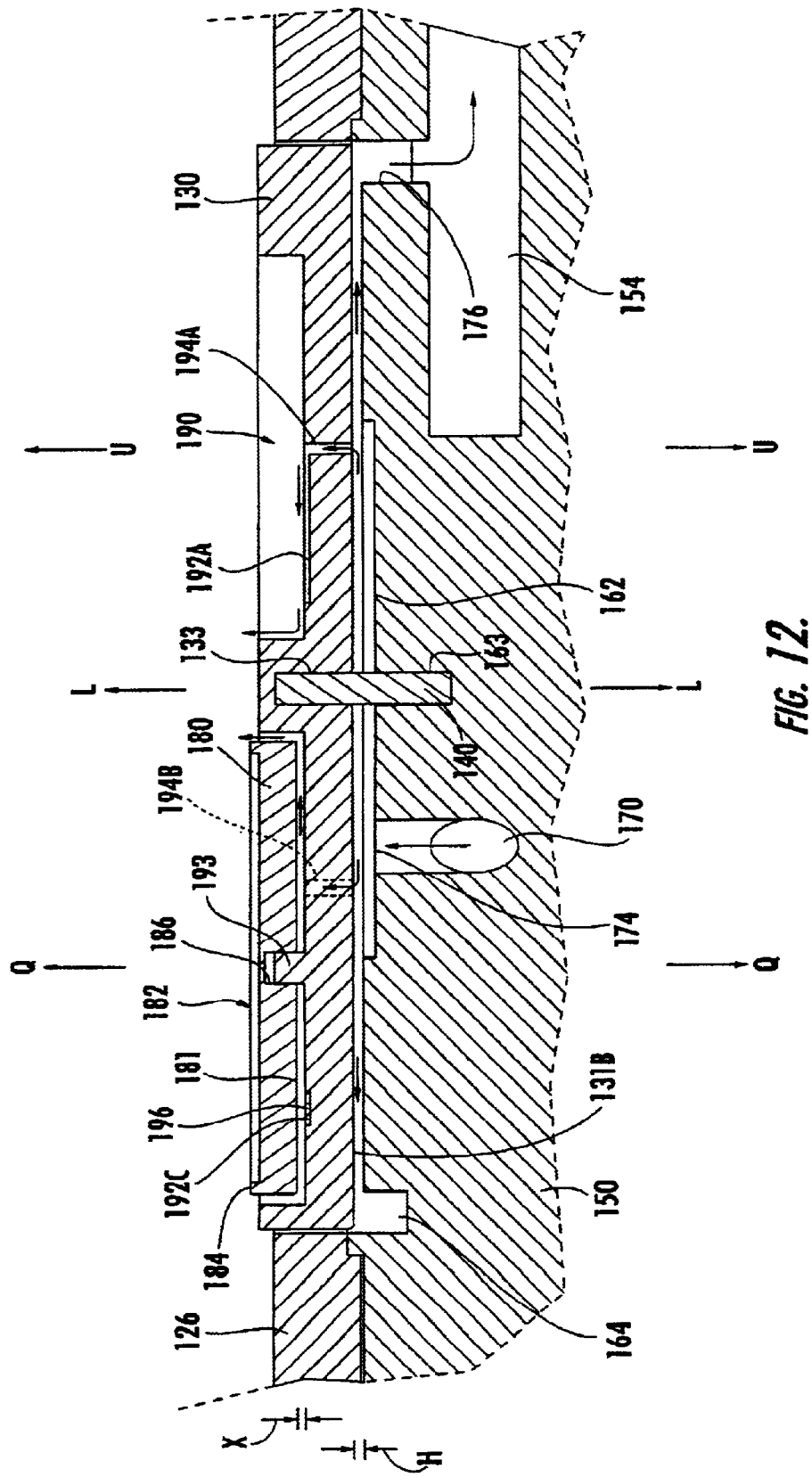
FIG. 12 is a cross-sectional view of the susceptor assembly of FIG. 1 taken along the line 12—12 of FIG. 11 wherein one of the satellite platters thereof is omitted for clarity.

The susceptor assembly 100 is adapted to provide planetary rotation of the several wafers 20 relative to the reactant gas flow and heated portions of the system 10. More particularly, the susceptor assembly 100 rotates the several wafers 20 about a common rotational axis L—L (FIG. 12) and simultaneously rotates each wafer about a respective individual rotational axis (e.g., rotational axis Q—Q; FIG. 12). Each of these rotational movements is driven by a flow of drive gas.

Turning to the susceptor assembly 100 in greater detail, and as best seen in FIGS. 1 and 2, the assembly 100 includes a cover member 110, side wall members 120 and a base member 150 forming a box which is open at an upstream or entrance end 110A and at an exit or downstream end 110B of the assembly 100. The members 110, 120, 150 are located by fasteners 122. A passage 102 extends fully through the assembly 100 from the end 110A to the end 110B. An upper liner 124 and a pair of lower liners 126 are mounted on the cover member 110 and the base member 150, respectively. Preferably, the liners 124, 126 are mounted and constructed as described in U.S. patent application Ser. No. 10/017,492, titled *Induction Heating Devices and Methods for Controllably Heating an Article*, filed Oct. 30, 2001,the disclosure of which is hereby incorporated herein by reference in its entirety. A main platter 130 is disposed in the passage 102 and is mounted for rotation about a pin or spindle 140. The platter 130 is preferably disk-shaped as illustrated. Three satellite platters 180 are mounted for rotation on the main platter 130 about respective spindle posts 193. The wafers 20 (FIG. 1) are mounted on the satellite platters 180.

With reference to FIGS. 1, 4, 5 and 12, the base member 150 has an upper surface 151A. An exhaust passage 154 is formed in the base member 150 adjacent the exit end 110B and terminates in an opening 154A. The base member 150 further includes a platter mounting portion 160 formed in the upper surface 151A. A gas supply passage 170 is formed in the base member 150 and fluidly communicates with a threaded inlet opening 172 and an outlet opening 174 in the portion 160. A connecting passage 176 provides fluid communication between the portion 160 and the passage 154, as discussed below.

The platter mounting portion 160 is preferably a recess or depression as illustrated. The portion 160 has a relatively deep, circumferential, endless channel 164, an inner or central recess 162 and a plurality of straight (i.e., rectilinear), generally radially extending main drive channels 168 which, in combination, form a plurality of landings 166 therebetween. Preferably, the channels 168 do not deviate from straight by more than standard, low cost manufacturing processes permit (typically on the order of 0.001 inch per inch of channel length). The main drive channels 168 are preferably symmetrically positioned with equidistant spacing about the central recess 162. More or fewer main drive channels 168 may be provided. The central recess 162 is preferably circular and the channel 164 and the central recess 162 are preferably substantially concentric as shown.

A spindle recess 163 is formed in the center of the central recess 162. The opening 174 is formed in the central recess 162 at a position offset from the center of the central recess 162.

The outer vertical wall 164B of the channel 164 extends up to the surrounding portion of the upper surface 151A. The inner vertical wall 164A of the channel 164 extends up to the landings 166. The connecting passage 176 has an upper opening in the bottom wall of the channel 164 and a lower opening at the passage 154.

The drive channels 168 each extend from an entrance end 168A to an exit end 168B. The entrance ends 168A each intersect the central recess 162 and the exit ends 168B each intersect the channel 164. The drive channels 168 extend at an angle with respect to a central axis of rotation L—L (see FIG. 12). More particularly, and with reference to FIG. 5, each drive channel 168 defines a central channel axis N—N that extends through the center of the channel 168. The axis N—N is offset from (i.e., does not intersect) the axis of rotation L—L (which, in FIG. 5, extends directed out of the paper through the center of the spindle recess 163). A straight reference line M—M intersects the channel axis N—N at the exit end 168B of the drive channel 168 and is tangential to a reference circle defined by the inner vertical wall 164A of the channel 164. The channel axis N—N and the reference line M—M define an included angle P therebetween. The angle P is less than 90 degrees. More preferably, the angle P is between about 35 and 75 degrees. Most preferably, the angle P is between about 45 and 65 degrees.

Preferably, the drive channels 168 have a width of between about 0.5 and 0.1 inch. Preferably, the drive channels 168 have a depth of between about 0.002 and 0.020 inch.

Preferably, the outer vertical wall 164B of the channel 164 and the outer peripheral edge 134 of the platter 130 define a gap therebetween having a width of between about 0.100 and 0.010 inch. Preferably, the channel 164 has a width of between about 0.250 and 0.050 inch and a depth below the landings 166 of between about 0.100 and 0.020 inch. The lengths J of the drive channels 168 and the diameter K of the inner vertical wall 164A (FIG. 4) will depend on the size of the main platter 130.

Preferably, the landings 166 are vertically recessed below the top surface 151A a distance that is approximately the same as the thickness of the platter 130. Preferably, the central recess 162 is vertically recessed from the landings 166 a distance of between about 0.100 and 0.010 inch. Preferably, the central recess 162 has a diameter I (FIG. 4) of between about 1.00 inch and 50% of the main platter diameter.

A drive gas supply device 171 is connected to the threaded inlet opening 172 for fluid communication with the passage 170. The gas supply device 171 is operable to force a flow of pressurized drive gas into the gas supply passage 170. The drive gas supply device 171 may be alternatively or additionally connected to the drive gas exhaust passage 154 to draw the drive gas from the base member 150. Suitable gas supply devices include Gilmont Instruments mass flow controllers available from Barnant Co. of Barrington, Ill. Preferably, the drive gas is nonreactive. More preferably, the drive gas is noble, particularly argon or helium. Most preferably, the drive gas is argon. Other suitable drive gases include $H_2$.

Figure 11:
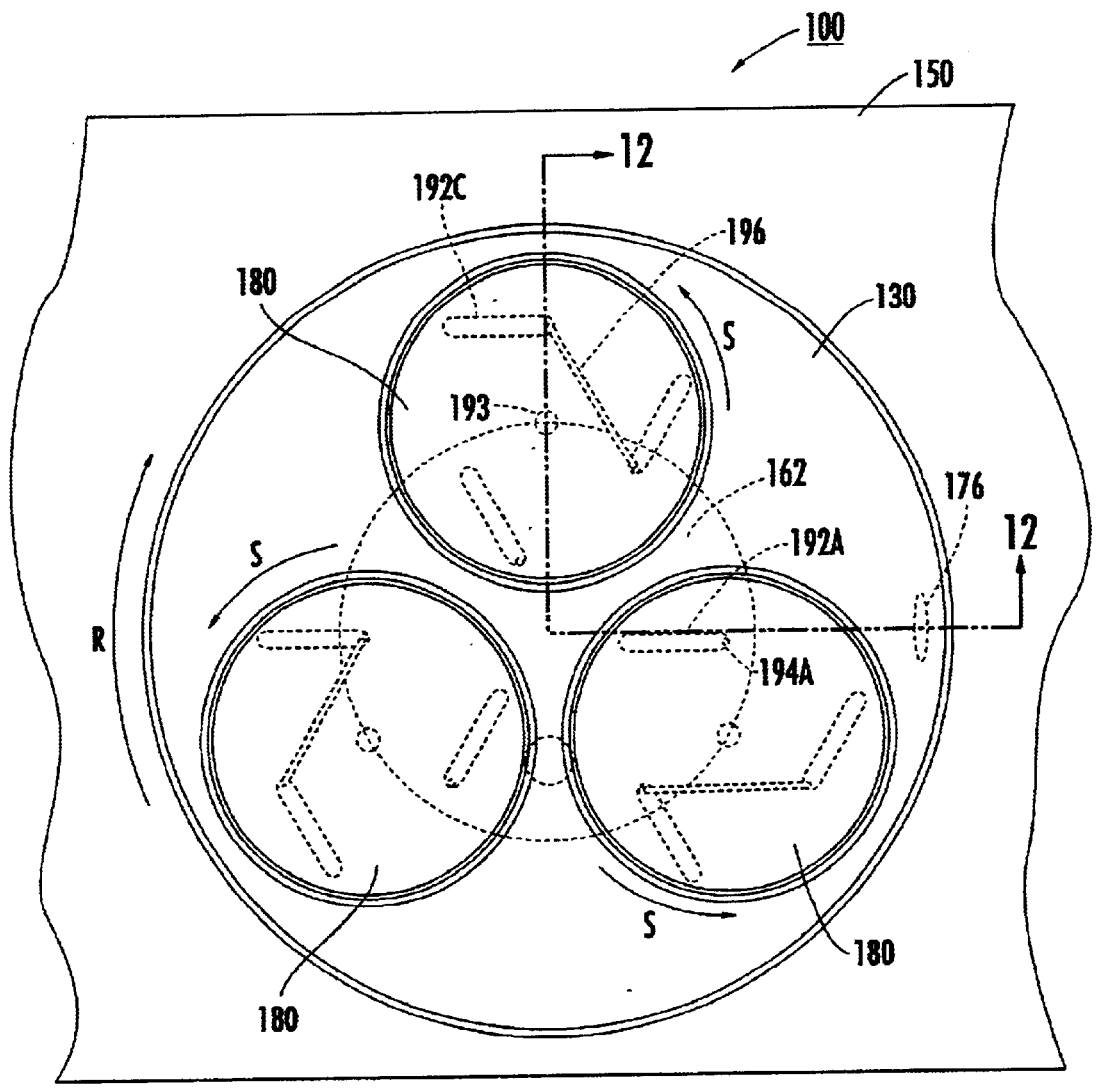
FIG. 11 is a top plan view of the susceptor assembly of FIG. 1 wherein a cover member and side members thereof are removed.

As best seen in FIGS. 11 and 12, the main platter 130 overlies the platter mounting portion 160 (FIG. 4) of the base member 150. With reference to FIGS. 1, 6–9 and 12, the main platter 130 is substantially circular and has an upper surface 131A, an opposing lower surface 131B, and an outer peripheral edge 134. A spindle recess 133 is formed in the lower surface 131B. The lower surface 131B is preferably substantially smooth without any grooves or protrusions other than the spindle recess 133.

As best seen in FIGS. 6–9, three satellite pockets 190 are formed in the upper surface 131A of the main platter 130. A spindle post 193 extends upwardly from each pocket 190. Preferably, each pocket 190 has a depth A (FIG. 7) of between about 0.1 and 0.3 inch. Preferably, each pocket 190 has a diameter B (FIG. 7) that is between about 0.005 and 0.2 inch greater than the diameter of the intended wafer. The pockets 190 are preferably positioned substantially equidistantly about the center (i.e., the axis L—L) of the main platter 130.

Three arrays 191 of passages and channels are located in each of the pockets 190, respectively. The arrays 191 are preferably substantially identical and symmetrically arrayed and oriented about the center of the platter 130. Accordingly, only one of the arrays will be described in detail below, it being understood that this description applies to the other two arrays 191 as well.

The array 191 includes three satellite drive channels 192A, 192B, 192C formed in the upper surface 131A of the main platter 131 within the recesses 190. A feed passage 194A extends fully through the platter 130 from the lower surface 131B to the upper surface 131A and fluidly intersects the drive channel 192A. A second feed passage 194B extends fully through the platter 130 from the lower surface 131B of the upper surface 131A and fluidly intersects the drive channel 192B. A feed channel 196 formed in the upper surface 131A extends between and fluidly intersects each of the drive channel 192B and the drive channel 192C such that the feed passage 194B is fluidly connected to the drive channel 192C by the feed channel 196.

Preferably, each drive channel 192A, 192B, 192C has a depth C (FIG. 7) of between about 0.002 and 0.020 inch, a length D (FIG. 6) of between about 20 and 80 percent of the wafer diameter, and a width E (FIG. 6) of between about 0.1 and 0.5 inch. Preferably, each feed channel 196 has a depth F (FIG. 9) of between about 0.006 and 0.080 inch, a length G (FIG. 6) of between about 25 and 100 percent of the wafer diameter, and a width H (FIG. 6) of between about 0.02 and 0.3 inch.

Preferably, and as illustrated, each of the satellite drive channels 192A, 192B, 192C is substantially straight (i.e., rectilinear). However, the channels 192A, 192B, 192C may be otherwise shaped (e.g., curvilinear or arcuately shaped).

As best seen in FIG. 12, the main platter 130 is mounted over and partially within the mounting portion 160. In FIG. 12, the main platter 130 is shown in a floating or levitated position as discussed below. The lower end of the spindle 140 is disposed in the recess 163 and the upper end of the spindle 140 is disposed in the recess 133. The central axis of the spindle 140 defines the axis of rotation L—L, which is orthogonal to the upper surface 131A of the main platter 130. The recess 133 is sized such that the main platter 130 can slide freely vertically up and down along the spindle 140 and such that the main platter 130 can rotate freely about the spindle 140 about the axis L—L.

Figure 10:
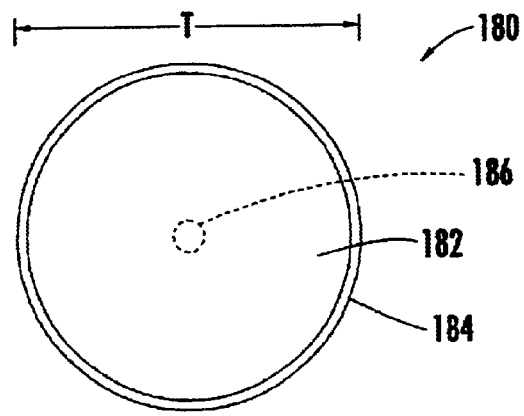
FIG. 10 is a top plan view of a satellite platter forming a part of the susceptor assembly of FIG. 1.

With reference to FIGS. 1, 10 and 12, the satellite platters 180 each include an upwardly opening wafer pocket 182 and a surrounding wall 184. Each pocket 182 is adapted to hold one of the wafers 20. The outer diameter T of the satellite platters 180 is preferably between about 0.005 and 0.2 inch less than the diameter of the pockets 190. A spindle recess 186 is formed in the lower surface of each satellite platter 180 to receive a corresponding one of the spindle posts 193 such that the platters 180 may slide freely up and down the posts 193.

The members 110, 120, 150, the main platter 130, and the spindle 140 are preferably formed of high purity graphite with a fully surrounding coating of dense SiC (i.e., impervious and having 0% porosity). Alternatively, the main platter 130 may be formed of solid SiC or a solid SiC alloy. Alternatively, the main platter 130 may be formed of graphite coated with TaC. The liners 126 are preferably formed of graphite coated with SiC or a refractory metal carbide such as TaC.

The satellite platters 180 may be formed of graphite impregnated with carbon. Alternatively, the platters 180 may be formed of graphite impregnated with carbon coated with SiC or TaC or unimpregnated graphite coated with SiC or TaC. Alternatively, the platters 180 may be formed of solid, uncoated SiC or SiC coated with TaC.

The susceptor assembly 100 may be used in the following manner. Initially, the platter 130 is disposed in the platter mounting portion 160 such that the platter 130 rests on the landings 166. The satellite platters are placed in the pockets 190. The wafers 20 are placed in the pockets 182 of the satellite platters 180. FIGS. 11 and 12 show the assembly 100 in use but with the wafers 20 being omitted for clarity. In FIG. 12, the left side satellite platter 180 is also omitted for clarity.

The gas supply device 171 is then actuated. The gas supply device 171 forces the drive gas through the inlet opening 172, the passage 180 and the outlet opening 174 as indicated by the arrows in FIG. 12. The drive gas enters the plenum formed by the central recess 162 and the overlying platter 130 from the outlet opening 174. The drive gas in the plenum is pressurized until the differential between the drive gas pressure and the ambient pressure (i.e., acting on the upper surface 131A of the platter 130) overcomes the gravitational force on the platter. In this manner, the pressurized drive gas forces the platter 130 upwardly (i.e., in the direction U; FIG. 12).

Figure 4:
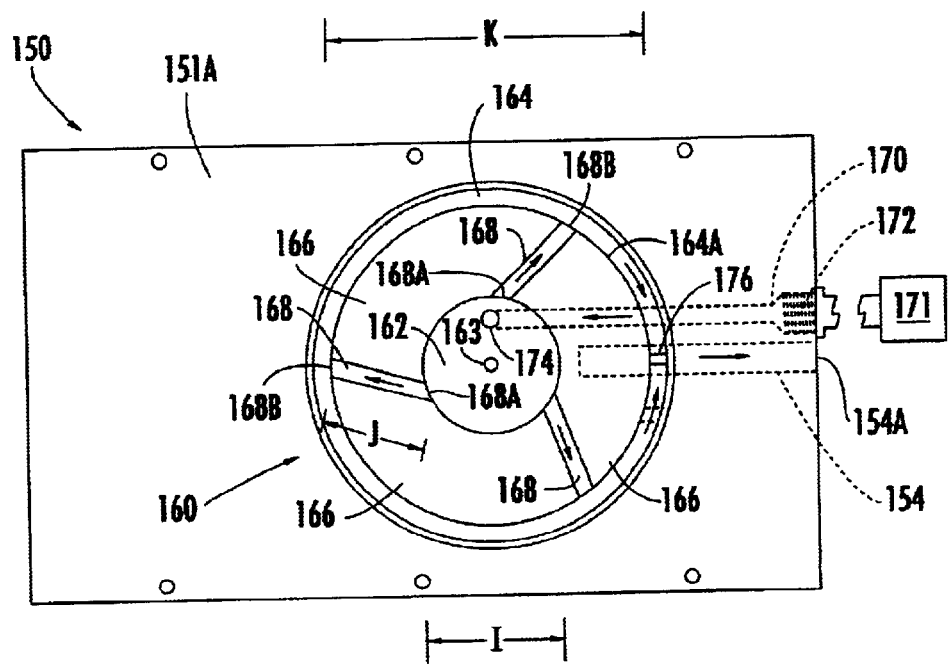
FIG. 4 is a top plan view of a base member forming a part of the susceptor assembly of FIG. 1.
Figure 5:
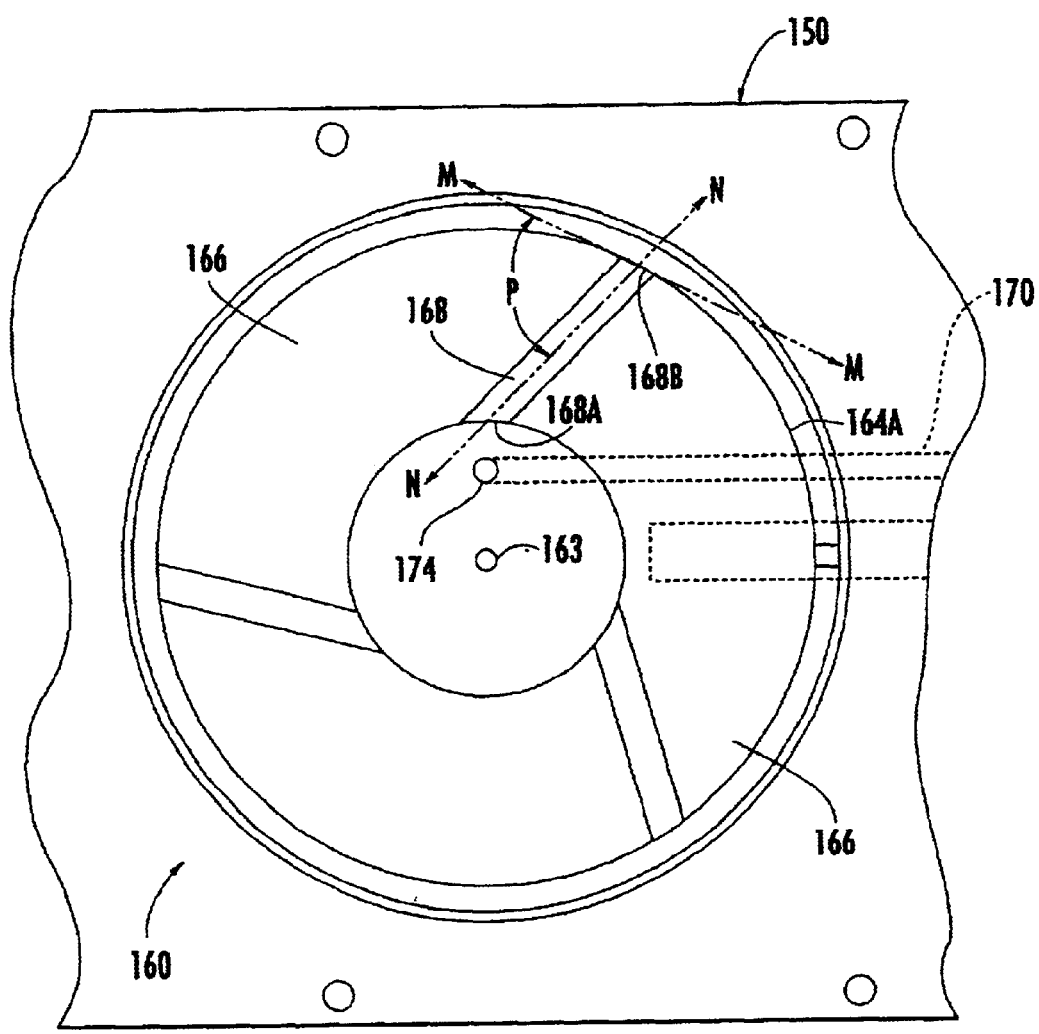
FIG. 5 is an enlarged, fragmentary, top view of the base member of FIG. 4.
Figure 6:
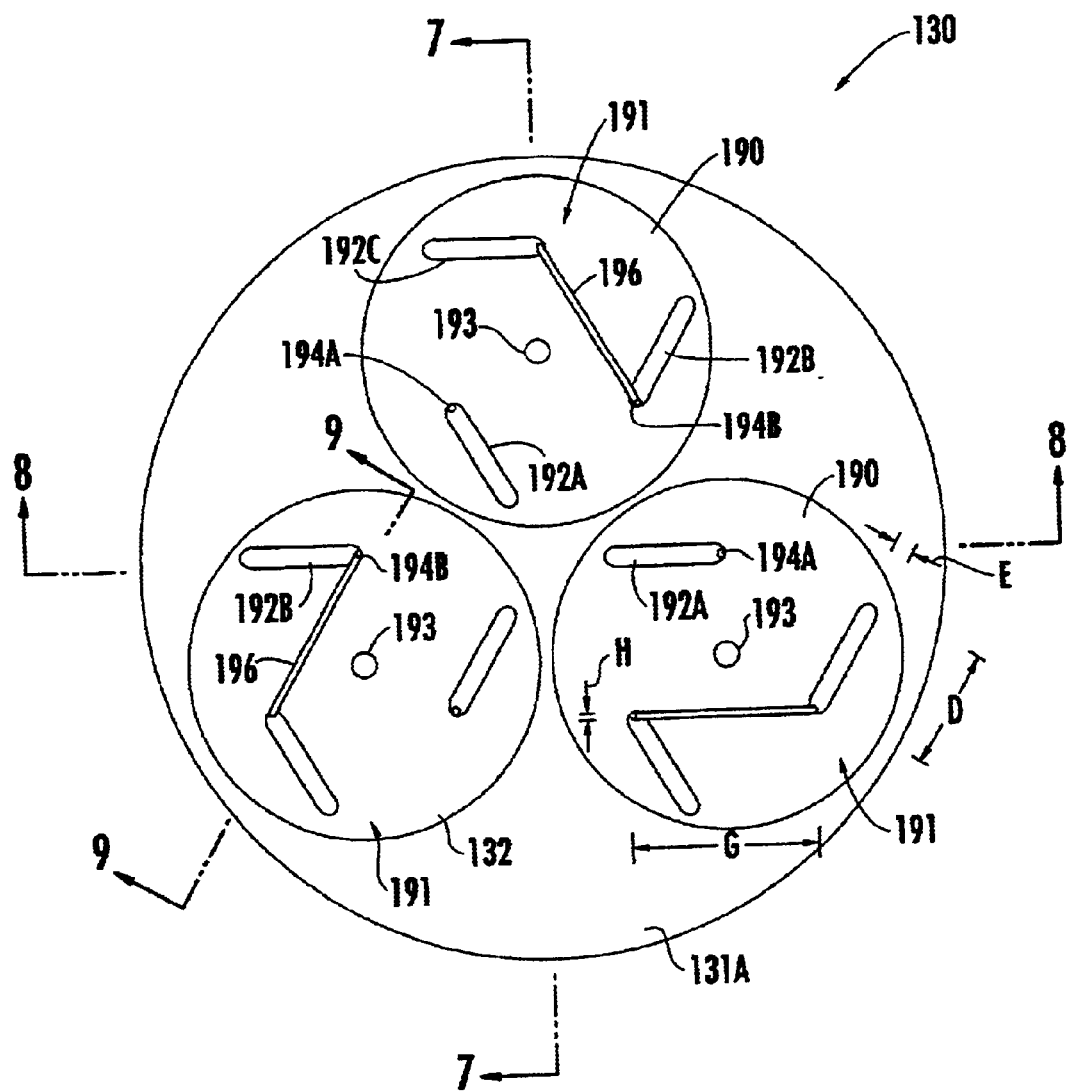
FIG. 6 is a top plan view of a main platter forming a part of the susceptor assembly of FIG. 1.
Figure 7:
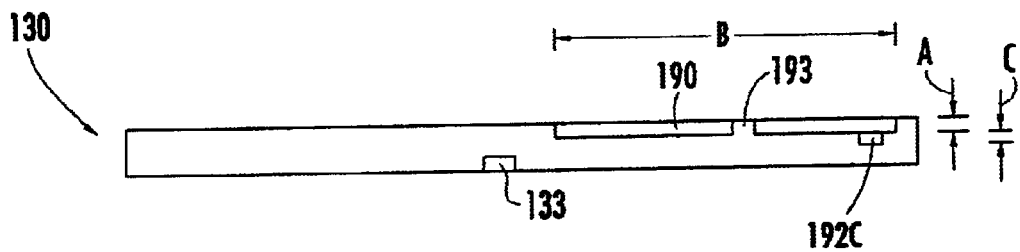
FIG. 7 is a cross-sectional view of the main platter of FIG. 6 taken along the line 7—7 of FIG. 6.
Figure 8:
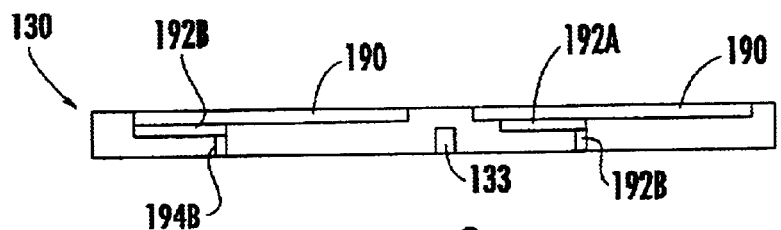
FIG. 8 is a cross-sectional view of the main platter of FIG. 6 taken along the line 8—8 of FIG. 6.
Figure 9:
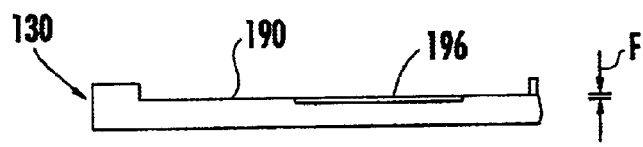
FIG. 9 is a cross-sectional view of the main platter of FIG. 6 taken along the line 9—9 of FIG. 6.

Once the platter 130 is levitated, a first portion of the drive gas flows outwardly from the central recess 162 between the platter 130 and the portion 160 of the base member 150 and into the channel 164 as indicated by arrows in FIG. 4. At least some of this first portion of the drive gas flows from the central recess 162 to the channel 164 through the drive channels 168 as indicated by the arrows in FIG. 4. Some of the drive gas exits the channel 164 through the connecting passage 176 and is exhausted from the base member 150 through the passage 154. Some of the drive gas may exit the channel 164 through the gap between the peripheral edge 134 and the outer vertical wall of the channel 164.

Some of the drive gas provided through the central recess 162 flows from the central recess 162 to the gap between the base member 150 and the lower surface 131B of the main platter 130. Some of this drive gas flows into the channel 164 and is exhausted through the passage 154 or about the peripheral edge 134 of the main platter.

In order to levitate and rotate the satellite platters 180, a second portion of the drive gas provided through the central recess 162 flows from the central recess 162, between the base member 150 and the lower surface 131B of the main platter 130, up through each of the feed passages 194A, 194B, and into the pockets 190. The drive gas from each feed passage 194A flows radially outwardly (relative to the rotational axis of the respective spindle post 193) through the adjacent drive channel 192A between the drive channel 192A and the lower surface of the overlying satellite platter 180, and out from the pocket 190 about the periphery of the platter 180.

A portion of the drive gas from each feed passage 194B flows radially outwardly along the adjacent drive channel 192B between the drive channel 192B and the platter 180. A further portion of the drive gas from the feed passage 194B flows through the feed channel 196 to the associated drive channel 192C, and through the drive channel 192C.

Additional portions of the drive gas from the feed passages 104A, 104B may flow radially outwardly between the pockets 180 and the satellite platters 180 and exhaust about the peripheries of the satellite platters 180 without flowing through the drive channels 192A, 192B, 192C or the feed channels 196.

The portions of the drive gas supplied through the feed passages 194A, 194B force the satellite platters 180 upwardly (i.e., in the direction U) and levitate the platters 180 above the main platter 130.

The drive gas is continuously forced through the assembly 100 at a rate and pressure sufficient to maintain the main platter 130 in a levitated position above the landings 166 and to maintain the satellite platters 180 in a levitated position above the main platter 130 as shown in FIG. 12. The levitation height of the main platter 130 may be controlled by selection of the width and depth of the drive channels 168, the diameter of the central recess 162, the pressure of the drive gas between the platter 130 and the portion 160, and the drive gas flow rate. The levitation height of the satellite platters 180 may be controlled by selection of the width and depth of the drive channels 192A, 192B, 192C, the diameters of the pockets 190 and the satellite platters 180, and the drive gas flow rate.

Additionally, the drive gas flow through the drive channels 168 is viscously coupled to the lower surface 131B of the platter 130. Because of the angled orientation of the drive channels 168, the platter 130 is thereby rotated about the axis L—L in a clockwise direction R (FIG. 11) by the flowing gas. The rate of rotation may be controlled by selection of the angle P (FIG. 12) defined by the drive channels 168 as well as the depth, width and length of the drive channels 168. Preferably, the rate of rotation of the platter 130 is between about 3 and 60 revolutions per minute (rpm).

Furthermore, the drive gas flow through the drive channels 192A, 192B, 192C is viscously coupled to the lower surfaces 181 of the satellite platters 180. Because of the angled orientation of the drive channels 192A, 192B, 192C, the satellite platters 180 are thereby rotated about the rotational axes defined by the spindle posts 193 (e.g., the rotational axis Q—Q as shown in FIG. 12) in a counter-clockwise direction S (FIG. 11) by the flowing gas. The rate of rotation may be controlled by selection of the angle and/or shape of the drive channels 192A, 192B, 192C as well as the depth, width and length of the drive channels 192A, 192B, 192C. Moreover, the rate of rotation of the satellite platters 180 may be controlled by selection of the flow rate of the drive gas. Preferably, the rate of rotation of the satellite platters 180 is between about 5 and 60 revolutions per minute (rpm).

The assembly 100 provides a number of advantages. The planetary rotation may provide a more uniform temperature environment as between respective wafers 20 and across each wafer 20. The planetary rotation may provide more uniform exposure of the wafers to the flow of process gas.

The use of common supplied drive gas flow to levitate and drive the rotation of both the main platter 130 and the satellite platters 180 may provide a less complex construction. The simplicity of the construction may provide for more consistent and controllable operation. By using a single gas flow, the cost and complexity of additional gas flow controls, valves, etc. can be reduced or eliminated. The assembly 100 may be designed such that very little or no additional drive gas need be supplied as compared to a simple rotation device (i.e., wherein only the main platter rotates).

The provision of straight drive channels 168 may provide certain advantages. Across a substantial range of drive gas flow rates, the spin rate of the platter 130 may be maintained at a given rate substantially independent of the drive gas flow rate. This allows for greater consistency (i e., repeatability) in processing. Additionally, this behavior allows for adjustment of the platter levitation height H (FIG. 12) by altering the drive gas flow rate.

Moreover, the provision of straight drive channels 168 may allow for improved control of the levitation height and rate of rotation of the satellite platters 180. Because the spin rate of the main platter 130 is independent of the drive gas flow rate (in a suitable range), the drive gas flow rate can be increased and decreased to in turn increase and decrease the spin rate and/or levitation height of the satellite platters 180 without significantly altering the spin rate of the main platter 130. As wear or deposits occur during normal use, the drive gas flow can be increased to levitate the main platter 130 and/or the satellite platters 180 at greater heights without significantly altering their rotation speeds.

The provision of straight satellite drive channels 192A, 192B, 192C may also allow improved control of the satellite platters 180. The drive channels 192A, 192B, 192C may be configured such that, across the desired range of drive gas flow rates, the spin rate of the satellite platters 180 may be maintained substantially independent of the drive gas flow rate. This may allow for greater consistency and/or for adjustment of the levitation height X (FIG. 12) by altering the drive gas flow rate.

The provision of counter-rotation between the main platter 130 and the satellite platters 180 may provide certain advantages as well. By counter-rotating, the differential between the rates of travel of different locations on the wafers with respect to the remainder of the susceptor assembly 100 and with respect to the flow of process gas is reduced. Furthermore, the counter-rotation may provide conservation of angular momentum that tends to cause the satellite platters 180 to continue rotating. This effect may cause the rotation of the satellite platters 180 to assist in restarting or accelerating rotation of the main platter 130 in the event the main platter 130 is stopped or slowed, and vice versa. Additionally, the induced angular momentum alone acting on the satellite platters 180 may be sufficient to cause the satellite platters 180 to rotate counter to the main platter 130 once the satellite platters 180 are levitated such that, according to some embodiments of the present invention, the satellite drive channels may be omitted.

The susceptor assembly 100 may be modified in various ways in accordance with the present invention. For example, the assembly 100 may be adapted such that the main platter 130 and the satellite platters 180 rotate in the same direction. A different number or configuration of satellite platters 180 may be provided. The central recess 162 and/or the pockets 190 may be omitted, in which case the respective drive gas feed passages 174, 194A, 194B are preferably replaced with one or more feed passages positioned symmetrically with respect to the rotational axis (axes) of the main platter or the satellite platters. The satellite platters 180 may be adapted to each hold more than one wafer. As noted above, the satellite drive channels (e.g., the channels 192A, 192B, 192C) may be differently shaped (e.g., non-straight). Multiple gas flows may be used such that separate (i.e., mutually exclusive) gas flows are used to drive the main platter and the satellite platters.

It is desirable to use argon (Ar) or like gases (e.g., other noble gases) as the drive gas because such gases are less likely than $H_2$ gas to pick up impurities such as boron (B), aluminum (Al), titanium (Ti), chromium (Cr), and vanadium (V) from the graphite, for example, and redeposit these impurities, for example, onto the wafer surface. However, the thermal conductivity of Ar gas is substantially less than that of $H_2$ gas. As a result, Ar gas present in the reactant gas flow through the tube 12 (FIG. 3) may slow the transfer of heat to the reactants, thereby creating irregularities in the temperature profile of the reactant gas flow. The assembly 100 may provide for exhaust of the drive gas with only minimal introduction of the drive gas into the reactant stream so that Ar gas may be used as the drive gas without jeopardizing the reactant stream temperature profile.

As described above, the drive gas preferably flows from an inner recess (e.g., the inner recess 162) to an outer channel (e.g., the outer channel 164). However, the direction of flow may be reversed (i.e., the drive gas being supplied through the passage 154 and exhausted through the passage 170).

Susceptor assemblies according to the present invention may incorporate any of the features and aspects as described in U.S. patent application Ser. No. 09/756,548, filed Jan. 8, 2001 and titled *Gas-Driven Rotation Apparatus and Method for Forming Silicon Carbide Layers*, the disclosure of which is hereby incorporated herein by reference in its entirety.

Figure 13:
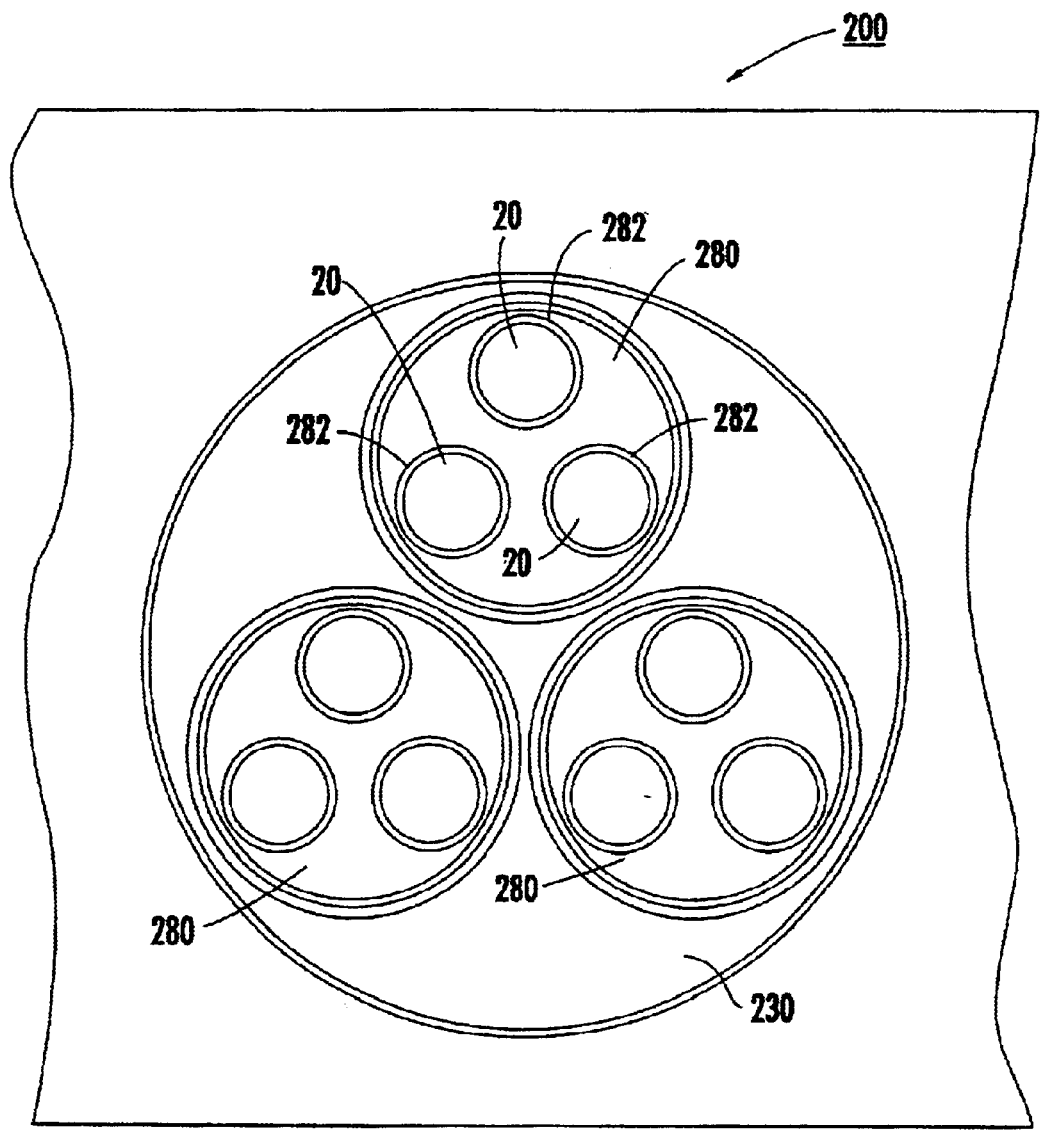
FIG. 13 is a top plan view of a susceptor assembly according to further embodiments of the present invention wherein a cover member and side members thereof are removed.

With reference to FIG. 13, a susceptor assembly 200 according to further embodiments of the present invention is shown therein. The assembly 200 differs from the assembly 100 only in that each satellite platter 280 thereof includes a plurality of wafer pockets 282 formed therein. Accordingly, a plurality of wafers 20 may be rotated on a common satellite platter 280 about both the rotational axis of the main platter 230 and the rotational axis of the respective satellite platter 280.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A gas driven rotation apparatus for use with a flow of drive gas, the apparatus comprising:
    a) a base member having an upper surface;
    b) a main platter overlying the upper surface of the base member; and
    c) a satellite platter overlying the main platter;
    d) wherein the apparatus is adapted to:
        direct the flow of drive gas between the upper surface of the base member and the main platter such that the main platter is rotated relative to the base member by the flow of drive gas; and
        direct at least a portion of the flow of drive gas from between the upper surface of the base member and the main platter to between the main platter and the satellite platter such that the satellite platter is rotated relative to the main platter by the at least a portion of the flow of drive gas.

2. The apparatus of claim 1 including a mounting portion formed in the upper surface of the base member, the mounting portion including at least one generally radially extending drive channel, wherein:
    the at least one drive channel is substantially straight; and
    the apparatus is adapted to direct the flow of drive gas through the drive channel to rotate the main platter relative to the base member about an axis of rotation.

3. The apparatus of claim 2 wherein the at least one drive channel includes a plurality of generally radially extending drive channels formed in the mounting portion and each of the drive channels is substantially straight.

4. The apparatus of claim 3 wherein each of the drive channels defines a drive channel axis which is offset from the axis of rotation.

5. The apparatus of claim 2 wherein the mounting portion includes first and second spaced apart recesses and the at least one drive channel extends from the first recess to the second recess.

6. The apparatus of claim 5 including:
a drive gas entrance passage extending through the base member and having an entrance opening in the first recess; and
a drive gas exhaust passage extending through the base member and having an exhaust opening in the second recess.

7. The apparatus of claim 1 including a drive gas supply device operative to provide the flow of drive gas.

8. The apparatus of claim 1 including a cover portion overlying the main platter, the satellite platter and the base member and a pair of side portions extending between the cover portion and base member on opposed sides of the main platter and the satellite platter, wherein the cover portion, the base member and the side portions define a through passage and opposed end openings, the main platter and the satellite platter being disposed in the through passage.

9. The apparatus of claim 1 wherein the axis of rotation is vertically oriented.

10. The apparatus of claim 1 wherein the apparatus is operative to rotate the main platter and the satellite platter in opposite rotative directions.

11. The apparatus of claim 1 including a feed passage extending through the main platter and providing a path for the flow of drive gas from between the upper surface of the base member and the main platter to between the main platter and the satellite platter.

12. The apparatus of claim 11 including at least one satellite drive channel formed in an upper surface of the main platter and underlying the satellite platter, wherein the apparatus is adapted to direct the flow of drive gas through the feed passage and the satellite drive channel to rotate the satellite platter relative to the main platter.

13. The apparatus of claim 12 including a feed recess in the upper surface of the base member and underlying the feed passage, wherein the apparatus is adapted to direct the flow of drive gas into the feed recess, through the feed passage, and through the satellite drive channel.

14. The apparatus of claim 13 wherein:
the satellite drive channel does not overlie the feed recess; and
the apparatus includes a feed channel formed in the upper surface of the main platter and fluidly connecting the feed passage and the satellite drive channel.

15. The apparatus of claim 14 including a second satellite drive channel fluidly connected to the feed channel.

16. The apparatus of claim 12 wherein the at least one satellite drive channel includes a plurality of satellite drive channels formed in the upper surface of the main platter.

17. The apparatus of claim 12 wherein the satellite drive channel extends generally radially.

18. The apparatus of claim 17 wherein the satellite drive channel is substantially straight.

19. The apparatus of claim 1 including a second satellite platter overlying the main platter, wherein the apparatus is adapted to direct a further portion of the flow of drive gas from between the upper surface of the base member and the main platter to between the main platter and the second satellite platter such that the second satellite platter is rotated relative to the main platter by the further portion of the flow of drive gas.

20. The apparatus of claim 1 wherein the satellite platter includes a plurality of wafer pockets formed therein.

21. The apparatus of claim 1 wherein the satellite platter is formed of graphite impregnated with carbon.

22. The apparatus of claim 1 wherein the satellite platter is formed of graphite coated with SiC or TaC.

23. The apparatus of claim 1 wherein the satellite platter is formed of SiC.

24. The apparatus of claim 23 wherein the satellite platter is coated with TaC.

25. The apparatus of claim 1 including at least one generally radially extending, substantially straight satellite drive channel formed in an upper surface of the main platter, wherein the apparatus is adapted to directat least a portion of the flow of drive gas through the satellite drive channel to rotate the satellite platter to the main platter about an axis of rotation. rotation.

26. The apparatus of claim 25 wherein the apparatus is operable to rotate the main platter relative to the base member.

27. The apparatus of claim 26 wherein the apparatus is adapted to direct the flow of drive gas between the upper surface of the base member and the main platter such that the main platter is rotated relative to the base member by the flow of drive gas.

* * * * *

UNITED STATES PATENT AND TRADEMARK OFFICE
CERTIFICATE OF CORRECTION

PATENT NO. : 6,797,069 B2
DATED : September 28, 2004
INVENTOR(S) : Paisley et al.

It is certified that error appears in the above-identified patent and that said Letters Patent is hereby corrected as shown below:

Column 12,
Line 36, should read -- wherein the apparatus is adapted to direct at least a portion of --
Line 39, should read -- rotation. --

Signed and Sealed this

Fifth Day of April, 2005

JON W. DUDAS
*Director of the United States Patent and Trademark Office*